(12) United States Patent
Dang et al.

(10) Patent No.: US 11,906,547 B2
(45) Date of Patent: Feb. 20, 2024

(54) SYSTEMS, APPARATUSES, OR COMPONENTS FOR ELECTROLYTIC CORROSION PROTECTION OF ELECTRONIC ELEMENT TESTING APPARATUSES

(71) Applicant: Intel Corporation, Santa Clara, CA (US)

(72) Inventors: Minh Nhat Dang, Ho Chi Minh (VN); Thi Mien Tran, Ho Chi Minh (VN)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 17/737,047

(22) Filed: May 5, 2022

(65) Prior Publication Data
US 2023/0358783 A1 Nov. 9, 2023

(51) Int. Cl.
*G01R 31/28* (2006.01)
*G01R 1/04* (2006.01)

(52) U.S. Cl.
CPC ........ *G01R 1/0408* (2013.01); *G01R 31/2849* (2013.01)

(58) Field of Classification Search
CPC ........ H02H 9/04; H02H 9/046; H02H 1/0015; H02H 7/003; H02H 9/041; H02H 9/02; H02H 3/26; H02H 3/20; H02H 3/023; H02H 3/04; H02H 3/08; H02H 7/045; G01R 31/52; G01R 31/002; G01R 31/54; G01R 31/2884; G01R 31/50; G01R 31/001; G01R 31/3835; G01R 35/00; G01R 1/0416; G01R 19/155; G01R 31/2829; G01R 1/36; G01R 29/12; G01R 31/14; G01R 31/68; G01R 31/2623; G01R 31/2851; G01R 31/2831; G01R 31/3646; G01R 15/165; G01R 19/145; G01R 1/203; G01R 15/18; G01R 27/14; G01R 27/08; G01R 31/08; H01B 1/04; H01B 1/08; H01B 1/02; H01B 1/22; H01B 13/0033; H01B 13/0036; H01B 1/24; H01B 13/30; H01B 1/18; H01B 11/206; H01B 7/0054; H01B 9/00; H01B 1/00; H01B 1/125; H01B 1/127; H01B 1/128; H01B 1/20; H01R 13/6485; H01R 12/00; H01R 12/7082;
(Continued)

(56) References Cited

U.S. PATENT DOCUMENTS 4,270,090 A * 5/1981 Williams .................. G01R 5/28
324/123 C
4,862,311 A * 8/1989 Rust .................... H01R 13/6666
361/111
(Continued)

*Primary Examiner* — Vinh P Nguyen
(74) *Attorney, Agent, or Firm* — VIERING, JENTSCHURA & PARTNER MBB

(57) ABSTRACT

An apparatus includes a tester chassis connected to a chassis electric reference potential for electrostatic discharge grounding of the tester chassis; a thermal head assembly coupled to the tester chassis, the thermal head assembly having a metallic thermal contact surface; and an electrical insulation arrangement disposed between the metallic thermal contact surface and the chassis electric reference potential to electrically insulate the metallic thermal contact from the chassis electric reference potential. An electrolytic corrosion protection system for the apparatus and a cable assembly for the apparatus.

20 Claims, 9 Drawing Sheets

(58) Field of Classification Search
CPC .......................... H01R 13/658; H01R 13/2457; H01R 13/665; H01R 13/6666; H01R 13/7175; H01R 2201/20
See application file for complete search history.

(56) References Cited

U.S. PATENT DOCUMENTS

| | | | | |
|---|---|---|---|---|
| 5,132,612 | A * | 7/1992 | Burns | G01R 31/2832 324/750.25 |
| 6,384,617 | B1 * | 5/2002 | Krajec | G01R 1/0408 324/756.07 |
| 6,628,131 | B1 * | 9/2003 | Ollila | G01R 31/2862 324/750.08 |
| 9,900,970 | B2 * | 2/2018 | Wang | H05K 1/11 |
| 9,989,557 | B2 * | 6/2018 | Howell | G01R 31/2867 |

* cited by examiner

SYSTEMS, APPARATUSES, OR COMPONENTS FOR ELECTROLYTIC CORROSION PROTECTION OF ELECTRONIC ELEMENT TESTING APPARATUSES

TECHNICAL FIELD

Various aspects relate generally to an electrolytic corrosion protection system for an electronic element testing apparatus, or an electronic element testing apparatus with electrolytic corrosion protection, or a cable assembly for use in the electrolytic corrosion protection system, or a cable assembly for use in the electronic element testing apparatus for electrolytic corrosion protection.

BACKGROUND

In assembly and test factories, it is known that stain-on-die issues on device under test, DUT, (e.g. bare die products) is due to leakage current from the marginal tester board causing electrolytic corrosion phenomena on the nickel-plated pedestal as it engages the DUT with a layer of liquid thermal interface material, LTIM, therebetween during testing. Corrosion on the pedestal gets aggravated as more units get tested leaving a more pronounced stain signature on the DUT. This resulted in a significant number of rejected units and multiple quality issues.

Attempts to resolve the issue include using an automatic tester leaked detection script to identify leaky tester card, i.e. failed hardware, and apply diagnostic to repair the suspected leaky tester card. However, the automatic tester leaked detection script is too slow, and slow corrosion still happen. Subsequent repair and fixing of tester card is also not practical as it results in factory lines down. Further, it is also not practical to delay repair and/or fixing of the tester card till natural lifespan of the tester card as the natural lifespan is more than 10 years.

Alternate attempts to resolve the issued include changing the pedestal plating from nickel to chrome as data has shown that chrome plating has better electrolysis corrosion resistance as compared to nickel plating. However, chrome plating process is more complicated than nickel plating, and common failures include chrome protrusions, holes, scratches, which can result in faster corrosion. Further, there are different chrome plating recipe and no high-quality chrome plating recipe is available. Hence, chrome plating is not presently feasible.

BRIEF DESCRIPTION OF THE DRAWINGS

Throughout the drawings, it should be noted that like reference numbers are used to depict the same or similar elements, features, and structures. The drawings are not necessarily to scale, emphasis instead generally being placed upon illustrating aspects of the disclosure. In the following description, some aspects of the disclosure are described with reference to the following drawings, in which.

DESCRIPTION

Figure 1:
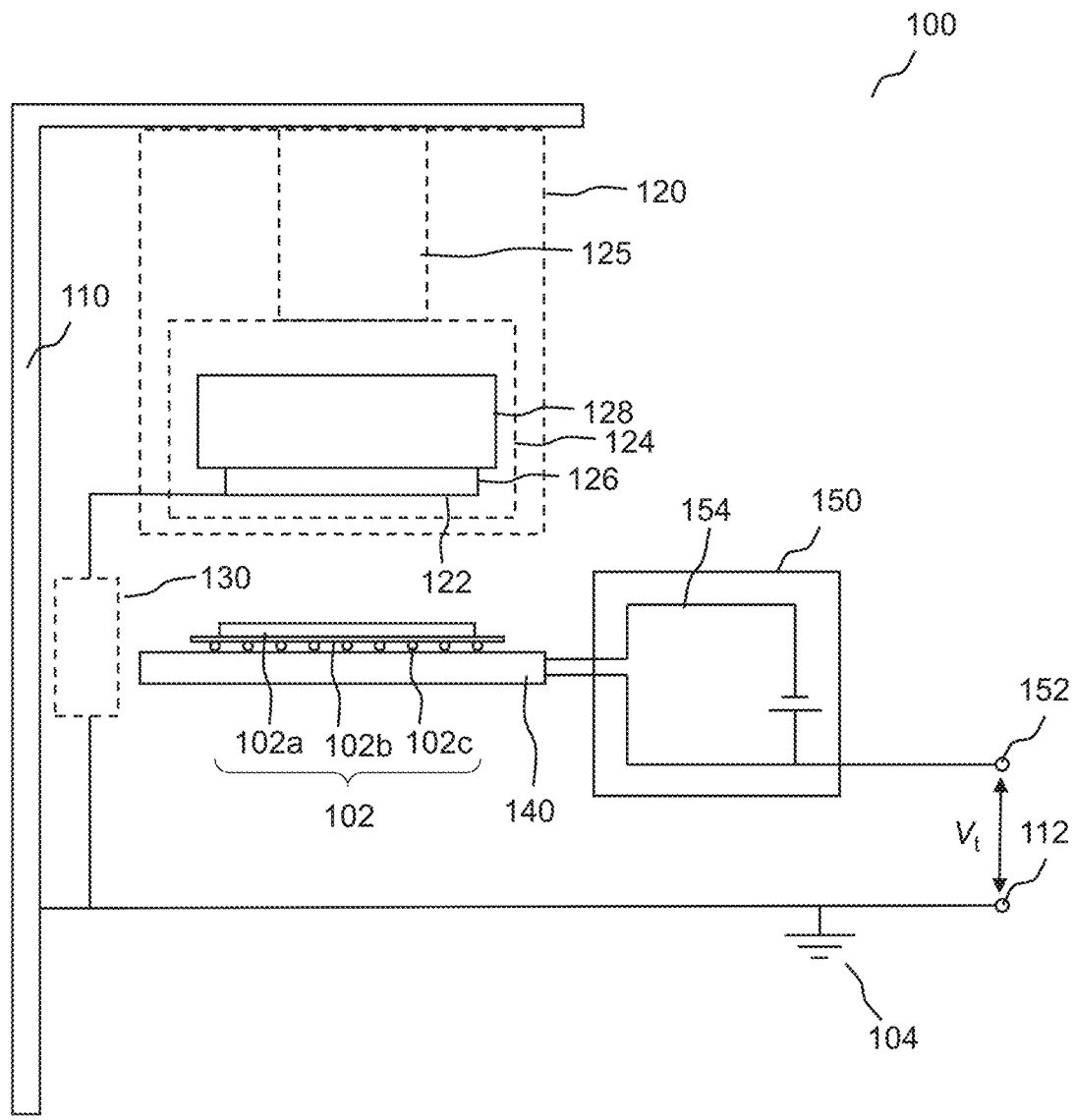
FIG. 1 shows a testing apparatus in a schematic view according to various aspects.

The following detailed description refers to the accompanying drawings that show, by way of illustration, specific details and aspects in which the disclosure may be practiced. One or more aspects are described in sufficient detail to enable those skilled in the art to practice the disclosure. Other aspects may be utilized and structural, logical, and/or electrical changes may be made without departing from the scope of the disclosure. The various aspects of the disclosure are not necessarily mutually exclusive, as some aspects can be combined with one or more other aspects to form new aspects. Various aspects are described in connection with methods and various aspects are described in connection with devices. However, it may be understood that aspects described in connection with methods may similarly apply to the devices, and vice versa.

The term "exemplary" or "example" may be used herein to mean "serving as an example, instance, or illustration". Any aspect or design described herein as "exemplary" is not necessarily to be construed as preferred or advantageous over other aspects or designs.

The terms "at least one" and "one or more" may be understood to include a numerical quantity greater than or equal to one (e.g., one, two, three, four, [ . . . ], etc.). The term "a plurality" may be understood to include a numerical quantity greater than or equal to two (e.g., two, three, four, five, [ . . . ], etc.).

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The words "plural" and "multiple" in the description and in the claims expressly refer to a quantity greater than one. Accordingly, any phrases explicitly invoking the aforementioned words (e.g., "a plurality of (objects)", "multiple (objects)") referring to a quantity of objects expressly refers more than one of the said objects. The terms "group (of)", "set (of)", "collection (of)", "series (of)", "sequence (of)", "grouping (of)", etc., and the like in the description and in the claims, if any, refer to a quantity equal to or greater than one, i.e. one or more.

The terms "processor" or "controller" as, for example, used herein may be understood as any kind of entity that allows handling data. The data may be handled according to one or more specific functions executed by the processor or controller. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

The term "memory" detailed herein may be understood to include any suitable type of memory or memory device, e.g., a hard disk drive (HDD), a solid-state drive (SSD), a flash memory, etc.

Differences between software and hardware implemented data handling may blur. A processor, controller, and/or circuit detailed herein may be implemented in software, hardware and/or as hybrid implementation including software and hardware.

The term "system" (e.g., an electrolytic corrosion protection system, etc.) detailed herein may be understood as a set of interacting elements, wherein the elements can be, by way of example and not of limitation, one or more mechanical components, one or more electrical components, one or more instructions (e.g., encoded in storage media), and/or one or more processors, and the like.

The phrase "electric reference potential" used in "chassis electric reference potential", "test circuit electric reference potential", and the like, may be used herein to mean a reference point from which a potential/voltage may be measured along respective conductive path for flow of current or electricity.

The phrase "electrostatic discharge grounding" used with regard to a "tester chassis" may include any suitable way of grounding the "tester chassis" to discharge built-up static charge for controlling static charge on the tester chassis.

The phrase "electrical insulation arrangement" used with regard to a "metallic thermal contact surface" and the "chassis electric reference potential" may be understood as one or more materials or elements or components placed (e.g. arranged, disposed, positioned, ordered, etc.) anywhere between the "metallic thermal contact surface" and the "chassis electric reference potential" to use as a tangible barrier for separating the "metallic thermal contact surface" and the "chassis electric reference potential" so as to reduce electrical conduction and/or does not allow electrical energy to pass through, wherein the materials or elements or components can be, by way of example and not of limitation, one or more mechanical components, one or more electrical components, and the like. The phrase "electrically insulated" may be construed accordingly.

The phrase "electric potential difference" used with regards to "chassis electric reference potential", "test circuit electric reference potential", and the like, may be used herein to mean a difference in electric potential (or voltage) between the two points.

The term "circuit" used in "test circuit", "heater circuit", "parallel circuit", and the like, may be used herein to mean a network of interconnecting electrical components for flow of current or electricity. Further, the "circuit" may be an uncomplete (i.e. partial or a portion of) or a fully completed circuit, an open circuit, and/or a closed circuit. The phrase "parallel circuit" may be used herein to mean two or more paths connected to the same electrically common points to form the network, each path having one or more electrical components connected between the same electrically common points.

The phrase "circuit ground" used with regards to "test unit", "test circuit", and the like, may be used herein to mean a single neutral reference point on the specific circuit measuring zero (0) volts, serving as a reference point for the specific circuit from which voltages at other points of the specific circuit are measured.

The phrases "circuit path", "first path", "second path" may be used herein to mean a route or course for current or electricity to flow from one point to another point. Accordingly, the phrases "circuit path", "first path", "second path" may be used herein to mean a portion of a circuit between two points of the circuit.

The terms "node" with regards to "circuit" may be used herein to mean a point of connection between two or more paths of the "circuit". Further, the terms "node" with regards to "first wire part" and "second wire part" may be used herein to mean a physical joint formed by connecting physical ends of the "first wire part" and "second wire part" together.

The terms "cable" or "cable assembly" may be used herein to mean physical cord-like component for connecting two physical devices. Accordingly, the "cable" or "cable assembly" may be an assembly of one or more wires running alongside each other and/or bundled together to form the physical cord of insulated electrical conductor.

The phrases "wire part", "wire segment", may be used herein to mean physical strand-like components which may serve as a core of the "cable" or "cable assembly". Further, the "wire part", "wire segment", may be used herein to mean a section or a portion or a segment of the core of the "cable" or "cable assembly".

The phrase "hardware element" may be used herein to mean physical machine (or mechanical) element or an elementary (or basic) mechanical part including, but not limited to, a space, a washer, a fastener, a linkage, a connector, a coupling, etc.

The phrase "non-conductive" may be used herein to mean not capable of conducting electricity or have very low electrical conductivity. Further, the phrase "non-conductive" with regards to "hardware element", "spacer", "washer", "fastener", "linkage", "connector", "coupling", and the like, may be used herein to mean that the respective component is configured to be "non-conductive", for example by being made of "non-conductive" material.

The phrase "joint or mechanical connection" may be used herein to mean a point or a place at which two physical components/objects/parts are joined or united or place in contact to each other.

FIG. 1 shows a testing apparatus 100 in a schematic view, according to various aspects. The testing apparatus 100 may be for functional testing of a device under test, DUT 102, to ensure performance meets a defined set of quality criteria, or for quality control purposes, prior to assembly and/or delivery. The DUT 102 may be an electronic device, including but not limited to, a semiconductor die, a semiconductor component, a semiconductor package, an integrated circuit, or an electronic component. In FIG. 1, as a non-limiting example, the DUT 102 is illustrated with a silicon die 102a on a substrate 102b having a plurality of contact elements 102c. It is understood that the DUT 102 may be in various configurations, forms, arrangements not shown.

According to various aspect, the testing apparatus 100 may include a tester chassis 110. The tester chassis 110 may be a frame, a body, and/or a casing of the testing apparatus 110. Further, the tester chassis 110 may be connected to a chassis electric reference potential 112. The chassis electric reference potential 112 may be for electrostatic discharge grounding of the tester chassis 110. According to various aspect, the testing apparatus 100 may include a grounding component connecting the tester chassis 110 to the earth ground 104 serving as the chassis electric reference potential 112. Hence, the chassis electric reference potential 112 may be based on the earth ground 104 as a reference potential.

According to various aspect, the testing apparatus 100 may include a thermal head assembly 120. The thermal head assembly 120 may be coupled to the tester chassis 110. During testing of the DUT 102 with the testing apparatus, the thermal head assembly 120 may be operable to heat and/or cool the DUT 102 to the prescribed temperature, and maintain the DUT 102 at the prescribed temperature. According to various aspect, the thermal head assembly 120 may include a metallic thermal contact surface 122. The metallic thermal contact surface 122 may serve as a thermal interface for thermal transfer, via thermal conduction, with the DUT 102 during testing. During testing, the thermal head assembly 120 may be operable to move the metallic thermal contact surface 122 relative to the tester chassis 110 to contact or abut the DUT 102 for regulating a temperature of the DUT 102. According to one aspect, the metallic thermal contact surface 122 may be plated with a metallic material, for example, including but not limited to, nickel plating or chrome plating.

According to various aspect, the testing apparatus 100 may include an electrical insulation arrangement 130. The electrical insulation arrangement 130 may include an arrangement of one or more electrical components or one or more mechanical components connected between two points to serve as a tangible barrier separating the two points so as to reduce electrical conduction and/or prohibit electrical energy to pass through between the two points. Further, the electrical insulation arrangement 130 may be disposed between the metallic thermal contact surface 122 and the chassis electric reference potential 112. Accordingly, the electrical insulation arrangement 130, being an arrangement of one or more electrical components or one or more mechanical components, may form the tangible barrier separating the metallic thermal contact 122 and the chassis electric reference potential 112 to reduce electrical conduction and/or prohibit electrical energy to pass through between them so as to electrically insulate the metallic thermal contact 122 from the chassis electric reference potential 112. Hence, the electrical insulation arrangement 130 may be configured to electrically insulate the metallic thermal contact 122 from the chassis electric reference potential 112.

In a conventional testing apparatus, a nickel-plated thermal interface of the thermal head may be directly grounded to a chassis of the conventional testing apparatus via grounding cable and/or direct contact with the chassis of the conventional testing apparatus. Further, during testing, the nickel-plated thermal interface may be engaging the DUT with a layer of liquid thermal interface material, LTIM. However, when the tester card of the conventional testing apparatus is faulty resulting in leakage current to the DUT, the direct grounding of the nickel-plated thermal interface of the thermal head may create an electrolytic cell condition between the nickel-plated thermal interface of the thermal head and the DUT, whereby the LTIM may serve as the electrolyte between the nickel-plated thermal interface of the thermal head and the DUT, the leakage current may serve as the power source for the electrolytic cell condition, and the direct grounding of the nickel-plated thermal interface of the thermal head may serve as to close the electrical path to the faulty tester card. The electrolytic cell condition between the thermal interface of the thermal head and the DUT may cause electrolytic corrosion phenomena resulting in the corrosion of the nickel-plated thermal interface and staining issues on the DUT.

Various aspects of the disclosure differ from the conventional testing apparatus in that direct grounding of the thermal interface to the chassis has been replaced with the electrical insulation arrangement 130 disposed between the metallic thermal contact surface 122 and the chassis electric reference potential 112. In doing so, the electrical insulation arrangement 130 may reduce or prohibit the current flow from the metallic thermal contact surface 122 and the chassis electric reference potential 112. Accordingly, an electrolytic corrosion current flow from the metallic thermal contact surface 122 to the chassis electric reference potential 112 may be significantly reduced or cut. Therefore, the electrolytic reaction may be significantly reduced or eliminated, and the possible electrolytic corrosion issue of the metallic thermal contact surface 122 as well as the possible staining issue of the DUT 102 may be solved. Hence, the incorporation of the electrical insulation arrangement 130 into the testing apparatus 100 may provide a corrosion protection function for the testing apparatus 100. Thus, various aspects may provide an electrolytic corrosion protection system for the testing apparatus 100, or provide the testing apparatus 100 with electrolytic corrosion protection.

According to various aspect, the testing apparatus 100 may include a DUT connector 140. The DUT connector 140 may be connectable with the DUT 102. Accordingly, the DUT connector 140 may be configured to receive the DUT 102. Hence, the DUT 102 may be connected or inserted or fitted to the DUT connector 140. Further, the DUT connector 140 may be configured for electrical connection with the DUT 102. Accordingly, the DUT 102 may establish an electrical connection with the DUT connector 140 when the DUT 102 is connected to the DUT connector 140. According to various aspect, the thermal head assembly 120 may be operable to move the metallic thermal contact surface 122 to contact the DUT 102 when the DUT 102 is connected to the DUT connector 140. Accordingly, the DUT connector 140 may be disposed with respect to the thermal head assembly 120 in a manner such that the DUT 102 connected to the DUT connector 140 may be in a movement path of the metallic thermal contact surface 122. According to one aspect, the DUT connector 140 may be in the form of a socket with a plurality of pins to contact with the plurality of contact elements 102c of the DUT 102. Further, in some aspects, the thermal head assembly 120 may be configured to move the metallic thermal contact surface 122 in an up and down movement along a vertical movement axis. Accordingly, the DUT connector 140 may be disposed directly under the metallic thermal contact surface 122 along the vertical movement axis such that an exposed surface of the DUT may be directly facing the metallic thermal contact surface 122.

According to various aspects, the testing apparatus 100 may include a test unit 150. The test unit 150 may be connected to the DUT connector 140. Accordingly, when the DUT 102 is connected to the DUT connector 140, the test unit 150 may communicate with the DUT 102 via the DUT connector 140. Further, the test unit 150 may be configured to run test programs for performing functional testing of the DUT connected to the DUT connector 140. Accordingly, the test unit 150 may communicate with the DUT 102 by sending any one or a combination of a signal, a voltage, a current, or data via the DUT connector 140 connecting the DUT 102 to the test unit 150. Further, the test unit 150 may include a test circuit electric reference potential 152. The test circuit electric reference potential 152 may serve as a circuit ground for the test unit 150. Accordingly, the test unit 150 may use the test circuit electric reference potential 152 as the neutral reference point, i.e. the zero (0) volts reference point, for measuring voltage or potential within the test unit 150 to operate the test unit 150 for running the test programs and/or communicating with the DUT 102.

According to various aspects, the test unit 150 may include a test circuit 154. The test circuits 154 may include one or more electrical components, one or more electronic components, one or more controllers, one or more processors, and/or one or more memories for running test programs and/or communicating with the DUT 102. In order for the test circuit 154 to communicate and run test programs on the DUT 102, the DUT 102 may be connected to the test circuit 154. Accordingly, the test circuit 154 may be configured to receive the DUT 102 so as to connect the DUT 102 to the test circuit 154. As an example, the DUT 102 may be connected to the test circuit 154 of the test unit 150 via the DUT connector 140. Further, the test circuit electric reference potential 152 of the test unit 150 may serve as the circuit ground for the test circuit 154 of the test unit 150. Accordingly, the test circuit 154 may include the test circuit electric reference potential 152. Hence, the test circuit electric reference potential 152 may serve as the neutral reference point, i.e. the zero (0) volts reference point, for the test circuit 154 from which voltages or potentials at other points of the test circuit 154 may be measured.

According to various aspects, an electric potential difference, $V_r$, may exist between the chassis electric reference potential 112 and the test circuit electric reference potential 152. Accordingly, the test circuit electric reference potential 152 may be at a different voltage or potential than the chassis electric reference potential 112, when using the chassis electric reference potential 112 as a reference for comparison. Hence, the chassis electric reference potential 112 and the test circuit electric reference potential 152 may be unique reference potential that do not form a common ground or common reference potential. Thus, a voltage or potential may be measured across the chassis electric reference potential 112 and the test circuit electric reference potential 152.

Due to the electric potential difference, $V_r$, between the chassis electric reference potential 112 and the test circuit electric reference potential 152, the likelihood of creating the electrolytic cell condition between the nickel-plated thermal interface of the thermal head and the DUT may be aggravated when there is a leakage current from the test unit 150 that is faulty. According to various aspects, the electrical insulation arrangement 130 disposed between the metallic thermal contact surface 122 and the chassis electric reference potential 112 may reduce or prohibit the current flow from the metallic thermal contact surface 122 and the chassis electric reference potential 112 so as to significantly reduce or cut the electrolytic corrosion current flow from the metallic thermal contact surface 122 to the chassis electric reference potential 112. Therefore, the electrolytic reaction may be significantly reduced or eliminated, and the possible electrolytic corrosion issue of the metallic thermal contact surface 122 as well as the possible staining issue of the DUT 102 may be solved.

According to some aspects, the thermal head assembly 120 may include a head unit 124. The head unit 124 may include a contact member 126 and a heater 128. According to some aspects, the metallic thermal contact surface 122 may be an exposed surface of the contact member 126. The contact member 126 may be made of metallic material or may be plated or coated with metallic material so as to form the metallic thermal contact surface 122. In some aspects, the metallic material may be nickel or chrome.

According to some aspects, the heater 128 may be coupled to the contact member 126. The heater 128 may be configured to heat and/or cool the contact member 126 so as to control a temperature of the contact member 126 for thermal conduction with the DUT 102 via the metallic thermal contact surface 122 for regulating the temperature of the DUT 102 during testing. Accordingly, the heater 128 may be coupled to the contact member 126 in a manner so as to be capable of heating and/or cooling the contact member 126 for the metallic thermal contact surface 122 to be served as a thermal interface for thermal transfer, via thermal conduction, with the DUT 102 during testing. In some aspects, the heater 128 may be an electric heater, a non-electric heater, a fluid based heater, or the like. In some aspects, the metallic thermal contact surface 122 may be on a first side of the contact member 126. For example, the metallic thermal contact surface 122 may be on a side of the contact member 126 that may be exposed and/or facing (or directed towards) the DUT 102 when the DUT 102 is connected to the DUT connector 140. Further, the heater 128 may be coupled to a second side of the contact member 126. The first side and the second side may be different sides of the contact member 126. According to an aspect, the first side and the second side may be opposite sides of the contact member 126. For example, when the DUT 102 is connected to the DUT connector 140, the first side of the contact member 126 may be exposed and/or facing (or directed towards) the DUT 102 and the second side of the contact member 126 may be opposite the first side and may be directed away from the DUT 102.

According to some aspects, the contact member 126 and the heater 128 may be integrally coupled together. Accordingly, the contact member 126 and the heater 128 may be joined together in such a way so as to form the head unit 124 as a single unit. Therefore, the contact member 126 and the heater 128 may be movable together as a single whole relative to the tester chassis 110 for moving the metallic thermal contact surface 122 to contact or abut the DUT 102 when the DUT 102 is connected to the DUT connector 140. Hence, the thermal head assembly 120 may be operable to move the head unit 124 (or the contact member 126 and the heater 128 synchronously) relative to the tester chassis 110 so as to move the metallic thermal contact surface 122 for contacting or abutting the DUT 102 when the DUT 102 is connected to the DUT connector 140.

According to some aspects, the thermal head assembly 120 may include an actuator 125. The head unit 124 may be coupled to the actuator 125. Accordingly, the actuator 125 may be configured to actuate and move the head unit 124 (or the contact member 126 and the heater 128 synchronously) relative to the tester chassis 110 for moving the metallic thermal contact surface 122 to contact or abut the DUT 102 when the DUT 102 is connected to the DUT connector 140. According to an aspect, the actuator 125 may be connected between the tester chassis 110 and the head unit 124 so as to be operable to move the head unit 124 (or the contact member 126 and the heater 128 synchronously) relative to the tester chassis 110 for moving the metallic thermal contact surface 122 to contact or abut the DUT 102 when the DUT 102 is connected to the DUT connector 140.

Figure 2:
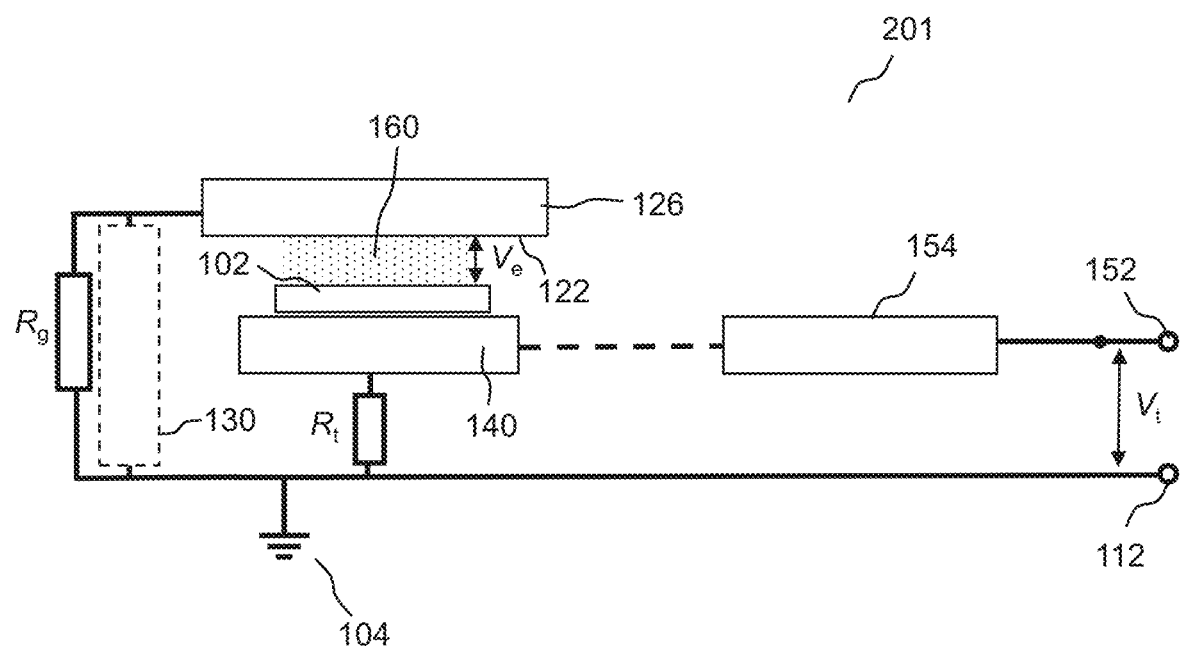
FIG. 2 shows an electrolytic corrosion protection system for the testing apparatus of FIG. 1 according to various aspects.

FIG. 2 shows an electrolytic corrosion protection system 201 for the testing apparatus 100 of FIG. 1 according to various aspects. In FIG. 2, the electrolytic corrosion protection system 201 is illustrated as a circuit diagram to show the electrical connections between the various components of the testing apparatus 100 of FIG. 1 to provide electrolytic corrosion protection against the electrolytic cell conditions within the testing apparatus 100 of FIG. 1.

According to various aspects, the electrolytic corrosion protection system 201 may include the test circuit 154. The test circuit 154 may be configured to receive the DUT 102 and to run test programs on the DUT 102. The DUT 102 may be connected to the test circuit 154 via the DUT connector 104. Further, the test circuit electric reference potential 152 may serve as the circuit ground for the test circuit 154. Accordingly, the DUT 102, the DUT connector 104, and the test circuit 154 may share the same test circuit electric reference potential 152.

According to various aspects, the electrolytic corrosion protection system 201 may include the metallic thermal contact surface 122. The metallic thermal contact surface 122 may be configured to contact the DUT 102 connected to the test circuit 154 during testing. The metallic thermal contact surface 122 may be movable relative to the tester chassis 110 such that the metallic thermal contact surface 122 may be brought into contact with the DUT 102 connected to the test circuit 154. The metallic thermal contact surface 122 may then be operable to regulate the temperature of the DUT 102 when in contact with the DUT 102 during testing.

According to various aspects, the electrolytic corrosion protection system 201 may include the chassis electric reference potential 112. The chassis electric reference potential 112 may be a reference potential to which the tester chassis 110 is connected for electrostatic discharge grounding of the tester chassis 110. Since the metallic thermal contact surface 122 may be directly or indirectly coupled to the tester chassis 110, the metallic thermal contact surface 122 may share the chassis electric reference potential 112.

According to various aspects, the electric potential difference, $V_f$, may exist between the chassis electric reference potential 112 and the test circuit electric reference potential 152. The electric potential difference, $V_f$, may be due to a resistance that exists between the test unit 150 (which contains the test circuit 154) and the tester chassis 110 when they are coupled or fitted or mounted together. Accordingly, a resistance, $R_f$, may exist between the chassis electric reference potential 112 and the test circuit electric reference potential 152. Thus, the resistance, $R_f$, between the chassis electric reference potential 112 and the test circuit electric reference potential 152 may cause the electric potential difference, $V_f$, to exist between the chassis electric reference potential 112 and the test circuit electric reference potential 152. Hence, a potential or voltage may be present across the chassis electric reference potential 112 and the test circuit electric reference potential 152. In some aspects, the resistance, $R_f$, may be in-built by the manufacturer of the testing apparatus 100. In an aspect, the resistance, $R_f$, may have a resistance between 250 K ohm to 280 K ohm, or about 262 K ohm.

When the test unit 150 and/or the test circuit 154 becomes faulty, leakage current may be resulted from the test circuit 154. Accordingly, the leakage current together with the electric potential difference, $V_f$, between the chassis electric reference potential 112 and the test circuit electric reference potential 152 may become a power source of the electrolytic cell conditions within the testing apparatus 100 of FIG. 1. Hence, the chassis electric reference potential 112, the test circuit electric reference potential 152, and the test circuit 154, may together form a power source portion of an electrolytic cell circuit within the testing apparatus 100 of FIG. 1.

Further, the DUT 102 being connected to the test circuit 154 may be analogous to a cathode portion of the electrolytic cell circuit within the testing apparatus 100 of FIG. 1, and the metallic thermal contact surface 122 may be analogous to an anode portion of the electrolytic cell circuit within the testing apparatus 100 of FIG. 1. During testing of the DUT 102, a liquid thermal interface material, LTIM, 160 may be applied between the DUT 102 and the metallic thermal contact surface 122. The LTIM 160 may serve as an electrolyte between the DUT 102 and the metallic thermal contact surface 122. Hence, the LTIM 160 may be the electrolyte portion for the electrolytic cell circuit within the testing apparatus 100 of FIG. 1.

According to various aspect, to provide electrolytic corrosion protection against the above described electrolytic cell circuit within the testing apparatus 100 of FIG. 1, the electrical insulation arrangement 130 may be connected between the metallic thermal contact surface 122 and the chassis electric reference potential 112 to insulate the metallic thermal contact surface 122 from the chassis electric reference potential 112. With the metallic thermal contact surface 122 electrically insulated from the chassis electric reference potential 112, electrical conduction may be reduced and/or electrical energy flow may be prohibited between the metallic thermal contact surface 122 and the chassis electric reference potential 112. Accordingly, flow of electrons between the metallic thermal contact surface 122, which is analogous to the anode portion of the electrolytic cell circuit within the testing apparatus 100 of FIG. 1, and the chassis electric reference potential 112, which is analogous to the power source portion of an electrolytic cell circuit within the testing apparatus 100 of FIG. 1, may be reduced or prohibited so as to minimize the effect of the electrolytic cell circuit and/or break the electrolytic cell circuit.

Therefore, providing electrolytic corrosion protection to the testing apparatus 100 of FIG. 1 may include identifying the electrolytic cell circuit within the testing apparatus 100 of FIG. 1 and providing the electrical insulation arrangement 130 into the electrolytic cell circuit so as to minimize the effect of the electrolytic cell circuit and/or break the electrolytic cell circuit by reducing or prohibiting the flow of electron within the electrolytic cell circuit and/or break the electrolytic cell circuit. Hence, the electrolytic corrosion protection system 201 of the testing apparatus 100 of FIG. 1 may include the electrical insulation arrangement 130 being inserted into the electrolytic cell circuit within the testing apparatus 100 of FIG. 1. Thus, the electrolytic corrosion protection system 201 of the testing apparatus 100 of FIG. 1 may include the various components creating the electrolytic cell conditions within the testing apparatus 100 of FIG. 1 and the electrical insulation arrangement 130. Accordingly, the electrolytic corrosion protection system 201 of the testing apparatus 100 of FIG. 1 may include the test circuit 154 with the test circuit electric reference potential 152, the metallic thermal contact surface 122, the chassis electric reference potential 122, and the electrical insulation arrangement 130 as described with reference to FIG. 2.

Figure 3:
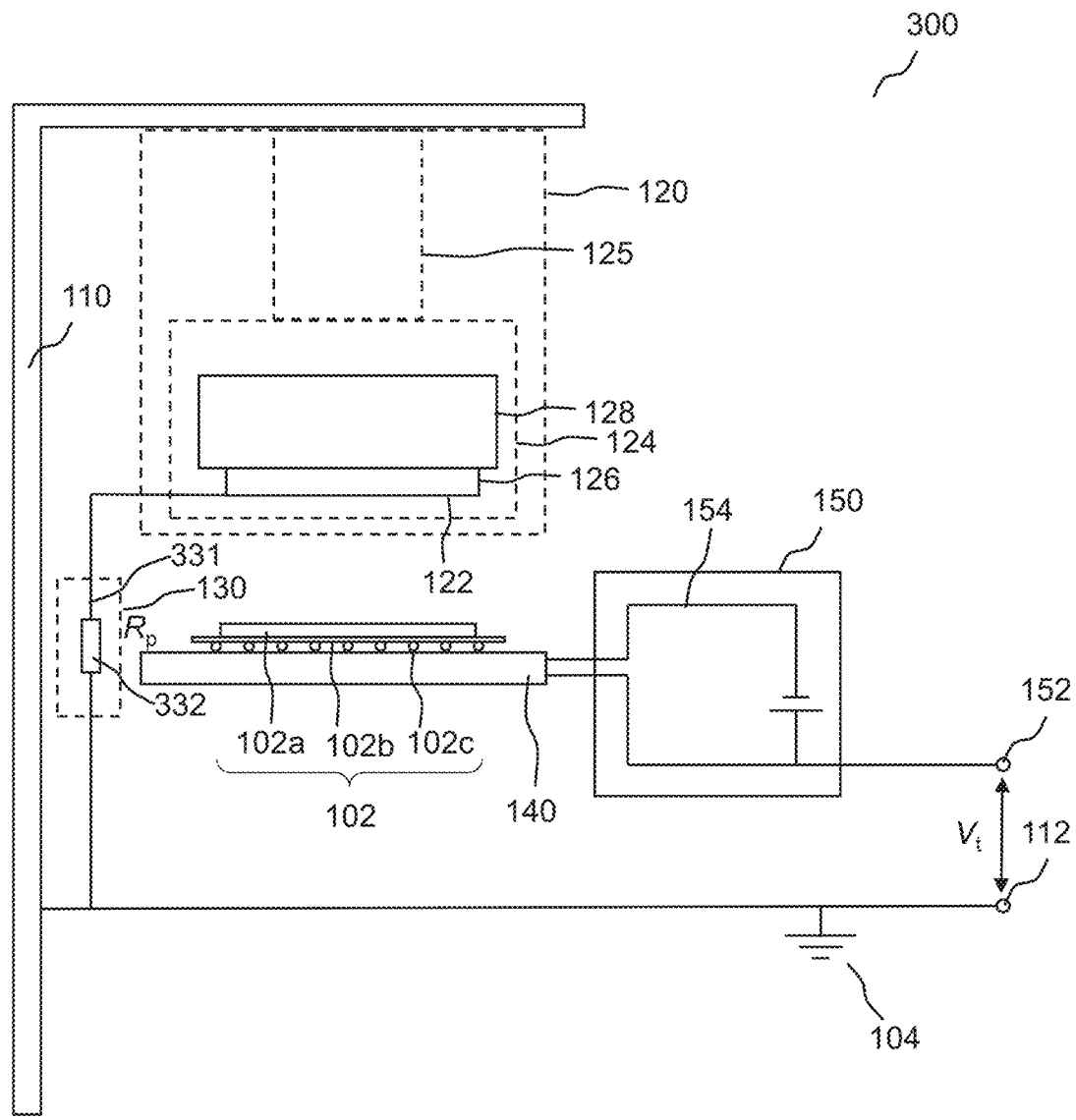
FIG. 3 shows a testing apparatus in a schematic view according to some aspects of the disclosure.

FIG. 3 shows a testing apparatus 300 as a variant of the testing apparatus 100 of FIG. 1 according to some aspects. The testing apparatus 300 of FIG. 3 may include all the features and limitations of the testing apparatus 100 of FIG. 1. Further, the testing apparatus 300 of FIG. 3 is illustrated with the electrical insulation arrangement 130 as being a predetermined resistor 332, $R_p$, connected between the metallic thermal contact surface 122 and the chassis electric reference potential 122. Hence, the testing apparatus 300 of FIG. 3 may include the predetermined resistor 332, $R_p$, serving as a variant of the electrical insulation arrangement 130 for the testing apparatus 100 of FIG. 1, whereby the electrical insulation arrangement 130 may be made up of electrical components. Accordingly, the electrical insulation arrangement 130 may include a circuit path 331 connecting the metallic thermal contact surface 122 to the chassis electric reference potential 122. Further, the circuit path 331 may include the predetermined resistor 332, $R_p$, connected between the metallic thermal contact surface 122 and the chassis electric reference potential 122.

With the predetermined resistor 332, $R_p$, connected between the metallic thermal contact surface 122 and the chassis electric reference potential 122, the predetermined resistor 332, $R_p$, serving as the electrical insulation arrangement 130 may form the tangible barrier separating the metallic thermal contact 122 and the chassis electric reference potential 112 to reduce electrical conduction and/or reduce electrical energy to a negligible amount passing through between them so as to electrically insulate the metallic thermal contact 122 from the chassis electric reference potential 112. Hence, the predetermined resistor 332, $R_p$, may reduce or prohibit the current flow from the metallic thermal contact surface 122 and the chassis electric reference potential 112. Accordingly, the electrolytic corrosion current flow from the metallic thermal contact surface 122 to the chassis electric reference potential 112 may be significantly reduced and/or reduced to a negligible amount. Therefore, the electrolytic reaction may be significantly reduced and/or eliminated, and the possible electrolytic corrosion issue of the metallic thermal contact surface 122 as well as the possible staining issue of the DUT 102 may be solved. Thus, connecting the predetermined resistor 332, $R_p$, between the metallic thermal contact surface 122 and the chassis electric reference potential 122 may provide a corrosion protection function for the testing apparatus 100, 300.

According to some aspects, the predetermined resistor 332, $R_p$, may have a resistance of at least 500 K ohms or more, or 1 M ohms or more. According to some aspects, the predetermined resistor 332, $R_p$, may have a resistance of about 500 K ohms, or 1 M ohms.

Figure 4:
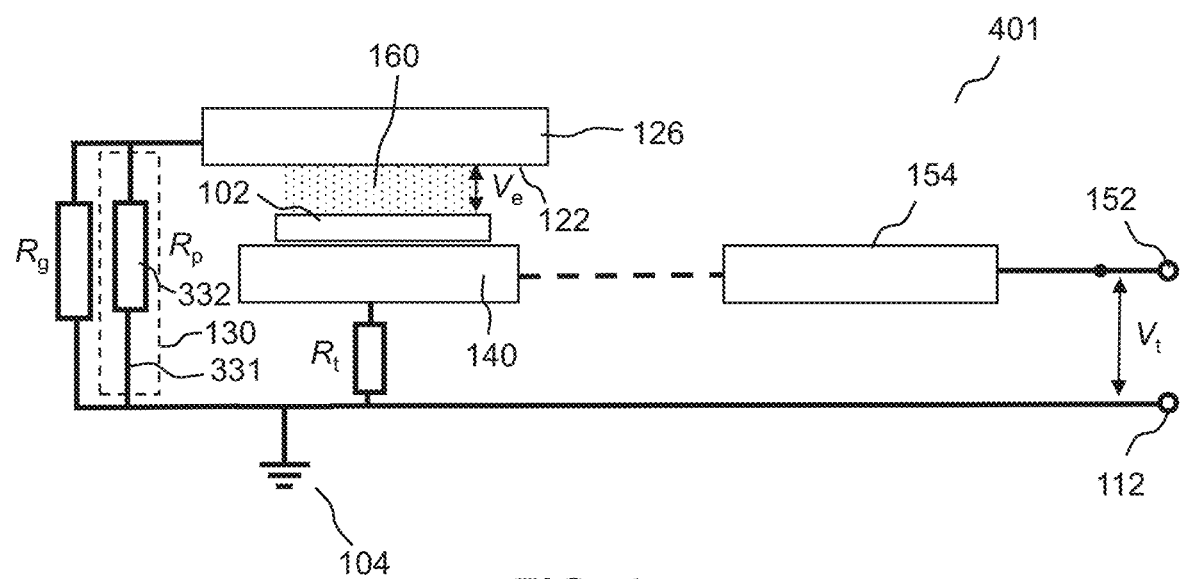
FIG. 4 shows an electrolytic corrosion protection system for the testing apparatus of FIG. 3 according to some aspects of the disclosure.

FIG. 4 shows an electrolytic corrosion protection system 401 for the testing apparatus 300 of FIG. 3 according to various aspects. Accordingly, the electrolytic corrosion protection system 401 of FIG. 4 may be a variant of the electrolytic corrosion protection system 201 of FIG. 2. Hence, the electrolytic corrosion protection system 401 of FIG. 4 may include all the features and limitations of the electrolytic corrosion protection system 201 of FIG. 2. As shown, the electrolytic corrosion protection system 401 of FIG. 4 may include the predetermined resistor 332, $R_p$, serving as a variant of the electrical insulation arrangement 130 for the electrolytic corrosion protection system 201 of FIG. 2. Accordingly, the electrical insulation arrangement 130 for the electrolytic corrosion protection system 401 of FIG. 4 may include the predetermined resistor 332, $R_p$.

In FIG. 2 and FIG. 4, the resistance, $R_g$, may be the pure resistance from the metallic thermal contact surface 122 to the chassis electric reference potential 122. Accordingly, the resistance, $R_g$, may be a resistance from the metallic thermal contact surface 122 to the chassis electric reference potential 122 when there is no direct path or short circuited path from the metallic thermal contact surface 122 to the chassis electric reference potential 122. According to some aspects, the resistance, $R_g$, may have a resistance of about 1.2e9 ohm. According to various aspects, instead of directly grounding the metallic thermal contact surface 122 to the chassis electric reference potential 122 for electrostatic discharge of the metallic thermal contact surface 122, the predetermined resistor 332, $R_p$, may be connected between the metallic thermal contact surface 122 and the chassis electric reference potential 122. As the predetermined resistor 332, $R_p$, may be significantly lower than the resistance, $R_g$, the current flow across the resistance, $R_g$, may be considered to be negligible. Hence, consideration may only be required for the predetermined resistor 332, $R_p$, to analysis the effect of predetermined resistor 332, $R_p$, on the electrolytic cell circuit within the testing apparatus 100, 300.

With the predetermined resistor 332, $R_p$, the electric potential difference, $V_t$, between the chassis electric reference potential 112 and the test circuit electric reference potential 152 may be divided across the predetermined resistor 332, $R_p$, and across the LTIM 160 between the DUT 102 and the metallic thermal contact surface 122. Accordingly, the electric potential, $V_e$, across the LTIM 160 between the DUT 102 and the metallic thermal contact surface 122 may be reduced significantly as compared to if the metallic thermal contact surface 122 is directly grounded to the chassis electric reference potential 122. With the reduction of the electric potential, $V_e$, across the LTIM 160 between the DUT 102 and the metallic thermal contact surface 122, the electrolytic reaction between the DUT 102 and the metallic thermal contact surface 122 may be significantly reduced or eliminated, and the possible electrolytic corrosion issue of the metallic thermal contact surface 122 as well as the possible staining issue of the DUT 102 may become negligible. Further, the predetermined resistor 332, $R_p$, connected between the metallic thermal contact surface 122 and the chassis electric reference potential 122 may still enable electrostatic discharge over time. Thus, the electrolytic corrosion protection system 401 with the predetermined resistor 332, $R_p$, between the metallic thermal contact surface 122 and the chassis electric reference potential 122 may provide corrosion protection function for the testing apparatus 100, 300 as well as continue to enable electrostatic discharge of the metallic thermal contact surface 122.

As an example for illustration, according to some aspects, the electric potential difference, $V_t$, between the chassis electric reference potential 112 and the test circuit electric reference potential 152 may be between 0.8 V to 2V. With the predetermined resistor 332, $R_p$, the electric potential difference, $V_t$, of 0.8V to 2V between the chassis electric reference potential 112 and the test circuit electric reference potential 152 may be divided across the predetermined resistor 332, $R_p$, and across the LTIM 160 between the DUT 102 and the metallic thermal contact surface 122 as compared to the electric potential difference, $V_t$, of 0.8V to 2V between the chassis electric reference potential 112 and the test circuit electric reference potential 152 being fully applied across the LTIM 160 between the DUT 102 and the metallic thermal contact surface 122 if the metallic thermal contact surface 122 is directly grounded to the chassis electric reference potential 122.

Figure 5:
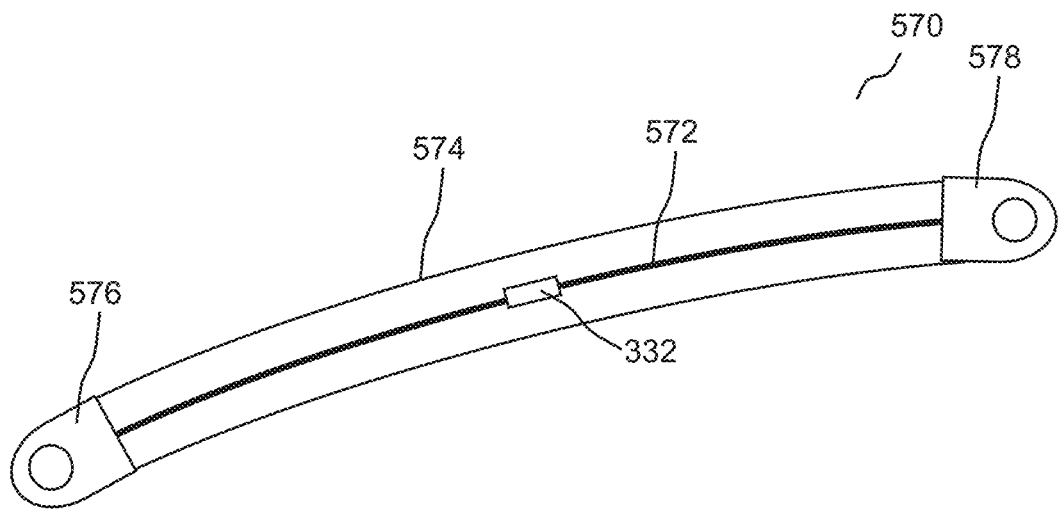
FIG. 5 shows a cable assembly according to an aspect of the disclosure.

FIG. 5 shows a cable assembly 570 according to an aspect of the disclosure. According to an aspect, the circuit path 331 of the electrical insulation arrangement 130 of the testing apparatus 300 may be embodied as the cable assembly 570. The cable assembly 570 may include a wire part 572. The predetermined resistor 332, $R_p$, may be disposed along the wire part 572 of the cable assembly 570. Accordingly, the predetermined resistor 332, $R_p$, may be joined as an integral segment or section of the wire part 572 of the cable assembly 570 or may be integrated into the wire part 572 of the cable assembly 570 so as to become an integral segment or section of the wire part 572 of the cable assembly 570. According to an aspect, a cable jacket 574 may be wrapped over the wire part 572. Accordingly, the cable jacket 574 may surround the wire part 572 including the predetermined resistor 332, $R_p$. Hence, the wire part 572 with the predetermined resistor 332, $R_p$, may form a core of the cable assembly 570 with the cable jacket 572 sleeved over the wire part 572. According to an aspect, the cable assembly 570 may include a first connector 576 at an end (or a first end) of the cable assembly 570 and a second connector 578 at an opposite end (or a second end) of the cable assembly 570. According to an aspect, the electrical insulation arrangement 130 of the testing apparatus 300 may be in the form of the cable assembly 570 with the first end of the cable assembly 570 connected to the metallic thermal contact surface 122 (or the contact member 126) and the second end of the cable assembly 570 connected to the chassis electric reference potential 122. For example, the first connector 576 at first end of the cable assembly 570 may be connected to the metallic thermal contact surface 122 (or the contact member 126) and the second connector 578 at the second end of the cable assembly 570 may be connected to the chassis electric reference potential 122. Each of the first connector 576 and the second connector 578 may include, but not limited to, a spade connector, a tab connector, a fork connector, a blade connector, or the like.

Figure 6:
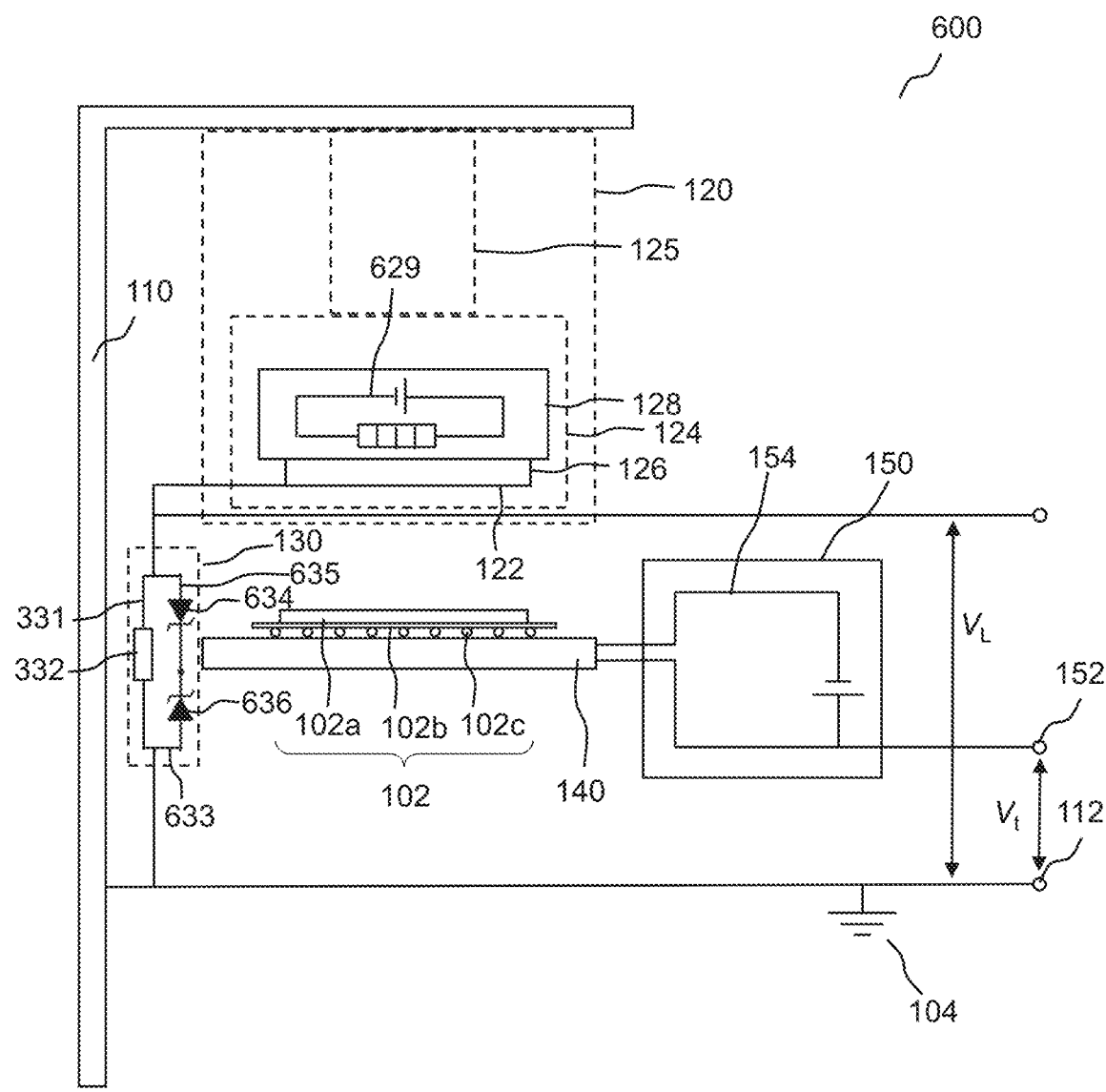
FIG. 6 shows a testing apparatus in a schematic view according to some aspects of the disclosure.

FIG. 6 shows a testing apparatus 600 as a variant of the testing apparatus 100 of FIG. 1 according to some aspects. The testing apparatus 600 of FIG. 6 may include all the features and limitations of the testing apparatus 100 of FIG. 1. According to some aspects, the heater 128 may be an electric heater. Accordingly, when the heater 128 is an electric heater, the heater 128 may include a heater circuit 629. Thus, the heater 128 of the testing apparatus 600 may include the heater circuit 629. Normally, the heater circuit 629 may not be connected to the contact member 126 and/or the metallic thermal contact surface 122. However, when the heater 128 is cracked or defective, a coil or a heater element of the heater circuit 629 may come into contact with the contact member 126 and/or the metallic thermal contact surface 122 and be electrically connected to the contact member 126 and/or the metallic thermal contact surface 122. As a result, a leakage voltage, $V_L$, may be caused by the defective heater 128 due to portions of the heater circuit 629 coming into direct contact with the contact member 126 and/or the metallic thermal contact surface 122. The heater leakage (or the leakage voltage, $V_L$) may cause electrical spark on the DUT 102 when the metallic thermal contact surface 122 is in contact with the DUT 102 during testing. Accordingly, the DUT 102 may be damaged by the heater leakage (or the leakage voltage, $V_L$). The leakage voltage, $V_L$, caused by the defective heater 128 may generally be significantly higher than the potential difference, $V_t$, between the chassis electric reference potential 112 and the test circuit electric reference potential 152. According to some aspects, the electrical insulation arrangement 130 of the testing apparatus 600 of FIG. 6 may be configured to electrically insulate the metallic thermal contact surface 122 from the chassis electric reference potential 112 when a potential across the electrical insulation arrangement 130 is within a predetermined range. The predetermined range of the potential across the electrical insulation arrangement 130 may be less than the leakage voltage, $V_L$, from the heater circuit 629 of the defective heater 128. Further, the electrical insulation arrangement 130 of the testing apparatus 600 of FIG. 6 may be configured to allow current to pass through the electrical insulation arrangement 130 when the potential across the electrical insulation arrangement 130 is outside of the predetermined range. According to an aspect, the leakage voltage, $V_L$, may be about 48 V or −48 V, and the predetermined range may be 10 V to −10 V.

Further, the testing apparatus 600 of FIG. 6 is illustrated with the electrical insulation arrangement 130 as being a parallel circuit 633 connected between the metallic thermal contact surface 122 and the chassis electric reference potential 122. Hence, the testing apparatus 600 of FIG. 6 may include the parallel circuit 633 serving as a variant of the electrical insulation arrangement 130 for the testing apparatus 100 of FIG. 1, whereby the electrical insulation arrangement 130 may be made up of electrical components. Accordingly, the electrical insulation arrangement 130 may include the parallel circuit 663 connecting the head unit 120 and/or the contact member 126 and/or the metallic thermal contact surface 122 to the chassis electric reference potential 122. Hence, the parallel circuit 633 may serve as the electrical insulation arrangement 130 of the testing apparatus 600.

According to some aspects, the parallel circuit 633 may include the circuit path 331 (or a first path) with the predetermined resistor 332 connected between the metallic thermal contact surface 122 to the chassis electric reference potential 122 in a manner similar to that of the testing apparatus 300. Accordingly, the circuit path 331 (or the first path) may connect the head unit 120 and/or the contact member 126 and/or the metallic thermal contact surface 122 to the chassis electric reference potential 122. The predetermined resistor 332 may electrically insulate the head unit 120 and/or the contact member 126 and/or the metallic thermal contact surface 122 from the chassis electric reference potential 122 along the circuit path 331 (or the first path). According to some aspects, the parallel circuit 633 may include a second path 635 arranged to be electrically parallel to the circuit path 331 (or the first path). Hence, the second path 635 may also connect the head unit 120 and/or the contact member 126 and/or the metallic thermal contact surface 122 to the chassis electric reference potential 122. The second path 635 may be configured in a manner such that, when the potential across the predetermined resistor 332 (or the parallel circuit 633) is within the predetermined range, the second path 635 may be akin to an opened path whereby current does not flow through the second path 635. Accordingly, the circuit path 331 (or the first path) may remain effective in providing electrolytic corrosion protection in the same manner by electrically insulating the metallic thermal contact surface 122 from the chassis electric reference potential 122 as previously described with reference to the testing apparatus 300 of FIG. 3 and the electrolytic corrosion protection 401 of FIG. 4 when the potential across the predetermined resistor 332 (or the parallel circuit 633) is within the predetermined range. On the other hand, when the potential across the predetermined resistor 332 (or the parallel circuit 633) is outside the predetermined range, the second path 635 may be akin to a closed path whereby current may flow through the second path 635.

According to some aspects, the second path 635 may include two oppositely oriented Zener diodes 634, 636 connected in series between the metallic thermal contact surface 122 (and/or the head unit 120 and/or the contact member 126) and the chassis electric reference potential 122. The two oppositely oriented Zener diodes 634, 636 may be configured to allow current to flow through the second path 635 when the potential across the parallel circuit 633 is outside the predetermined range. The two oppositely oriented Zener diodes 634, 636 may be configured stop current flow through the second path 635 when the potential across the parallel circuit 633 is within the predetermined range such that the circuit path 331 (or the first path) may be effective in providing electrolytic corrosion protection in the manner as previously described with reference to the testing apparatus 300 of FIG. 3 and the electrolytic corrosion protection 401 of FIG. 4.

Figure 7:
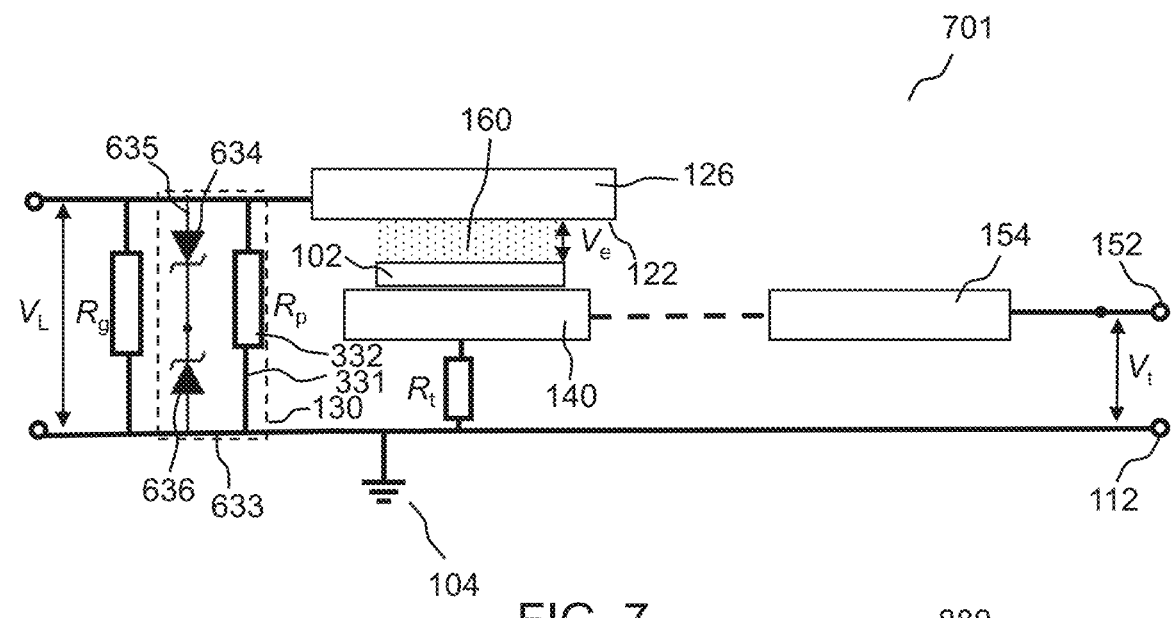
FIG. 7 shows an electrolytic corrosion protection system for the testing apparatus of FIG. 6 according to some aspects of the disclosure.

FIG. 7 shows an electrolytic corrosion protection system 701 for the testing apparatus 600 of FIG. 6 according to various aspects. Accordingly, the electrolytic corrosion protection system 701 of FIG. 7 may be a variant of the electrolytic corrosion protection system 201 of FIG. 2. Hence, the electrolytic corrosion protection system 701 of FIG. 7 may include all the features and limitations of the electrolytic corrosion protection system 201 of FIG. 2. As shown, the electrolytic corrosion protection system 701 of FIG. 7 may include the leakage voltage, $V_L$, from the heater circuit 629 and the parallel circuit 633 serving as a variant of the electrical insulation arrangement 130 for the electrolytic corrosion protection system 201 of FIG. 2. Accordingly, the electrical insulation arrangement 130 for the electrolytic corrosion protection system 701 of FIG. 7 may include the leakage voltage, $V_L$, from the heater circuit 629 and the parallel circuit 633.

Similar to FIG. 2 and FIG. 4, the resistance, $R_g$, in FIG. 6 may be the pure resistance from the metallic thermal contact surface 122 to the chassis electric reference potential 122. Similarly, the current flow across the resistance, $R_g$, may be considered to be negligible. Hence, consideration may only be required for the parallel circuit 633 to analysis the effect of the parallel circuit 633 on the electrolytic cell circuit as well as leakage voltage, $V_L$, from the heater circuit 629 within the testing apparatus 100, 600.

When the potential across the parallel circuit 633 is within the predetermined range, the oppositely oriented Zener diodes 634, 636 connected in series along the second path 635 of the parallel circuit 633 between the metallic thermal contact surface 122 (and/or the head unit 120 and/or the contact member 126) and the chassis electric reference potential 122 may not allow current flow and may be considered as an opened path. Accordingly, only the circuit path 331 (or the first path) with the predetermined resistor 332, $R_p$, between the metallic thermal contact surface 122 (and/or the head unit 120 and/or the contact member 126) and the chassis electric reference potential 122 may be effective. Thus, the electric potential difference, $V_t$, between the chassis electric reference potential 112 and the test circuit electric reference potential 152 may be divided across the predetermined resistor 332, $R_p$, and across the LTIM 160 between the DUT 102 and the metallic thermal contact surface 122 for electrolytic corrosion protection as previously described with reference to the testing apparatus 300 of FIG. 3 and the electrolytic corrosion protection 401 of FIG. 4. The predetermined range may be set based on the electric potential difference, $V_t$, between the chassis electric reference potential 112 and the test circuit electric reference potential 152 such that the potential across the parallel circuit 633 may likely be due to the test circuit 154 when the potential across the parallel circuit 633 is within the predetermined range. On the other hand, when the potential across the parallel circuit 633 is outside the predetermined range, it may most likely be due to the leakage voltage, $V_L$, from the heater circuit 629. Accordingly, the oppositely oriented Zener diodes 634, 636 connected in series along the second path 635 of the parallel circuit 633 between the metallic thermal contact surface 122 (and/or the head unit 120 and/or the contact member 126) and the chassis electric reference potential 122 may be configured to allow current flow in a manner such that the second path 635 may be considered as a closed path. In this manner, current from the heater leakage may be drained so as to prevent damage to the DUT 102.

Figure 8:
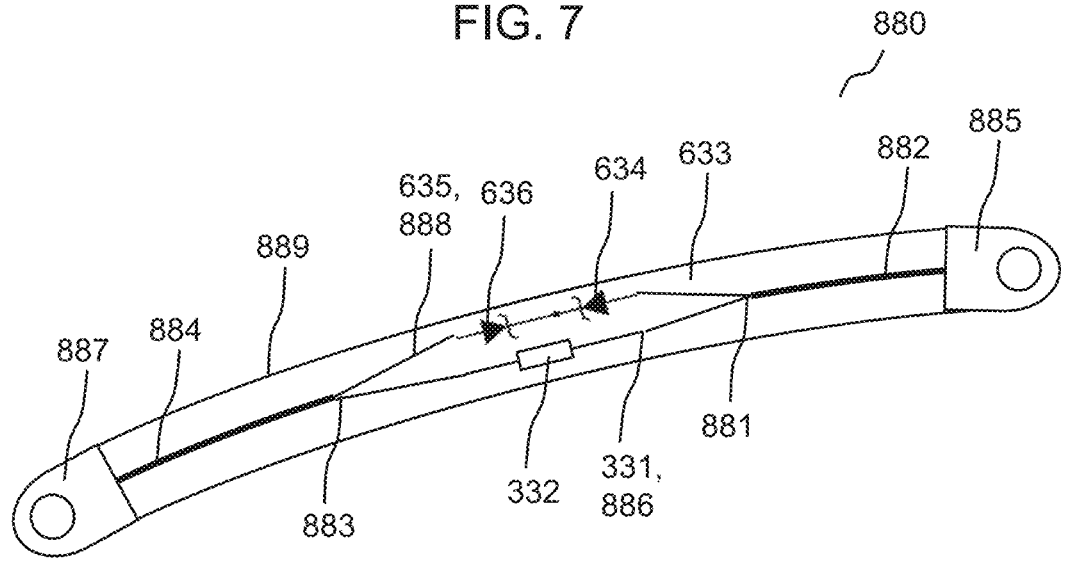
FIG. 8 shows a cable assembly according to an aspect of the disclosure.

FIG. 8 shows a cable assembly 880 according to an aspect of the disclosure. According to an aspect, the electrical insulation arrangement 130 of the testing apparatus 600 with the parallel circuit 633 may be embodied as the cable assembly 880. The cable assembly 880 may include a first wire segment 882 and a second wire segment 884. Each of the first wire segment 882 and the second wire segment 884 may be a strand of conductive material. The parallel circuit 633 may be connected between the first wire segment 882 and the second wire segment 884. The first path (or the circuit path 331) of the parallel circuit 633 with the predetermined resistor 332, $R_p$, may be connected between a first node 881 and a second node 883. The second path 635 of the parallel circuit 633 with the two oppositely oriented Zener diodes may be connected in series between the first node 881 and the second node 883. The first path and the second path 635 may be electrically parallel paths of the parallel circuit 633. Further, the first wire segment 882 may be connected to the first node 881 and the second wire segment 884 may be connected to the second node 883.

According to an aspect, the first path (or the circuit path 331) of the parallel circuit 633 may be in the form of a first wire part 886, similar to the wire part 572 of the cable assembly 570. The predetermined resistor 332, $R_p$, may be disposed along the first wire part 886 of the cable assembly 880. Accordingly, the predetermined resistor 332, $R_p$, may be joined as an integral segment or section of the first wire part 886 of the cable assembly 880 or may be integrated into the first wire part 886 of the cable assembly 880 so as to become an integral segment or section of the first wire part 886 of the cable assembly 880. According to an aspect, the second path 635 of the parallel circuit 633 may be in the form of a second wire part 888. The two oppositely oriented Zener diodes 634, 636 may be connected in series along the second wire part 888 of the cable assembly 880. Accordingly, each of the two oppositely oriented Zener diodes 634, 636 may be joined as an integral segment or section of the second wire part 888 of the cable assembly 880 or may be integrated into the second wire part 888 of the cable assembly 880 so as to become an integral segment or section of the second wire part 888 of the cable assembly 880.

An end of the first wire part 886 and a corresponding end of the second wire part 888 may be connected together to form the first node 881. An opposite end of the first wire part 886 and a corresponding opposite end of the second wire part 888 may be connected together to form the second node 883. The first wire part 886 and the second wire part 888 may be shielded from each other. For example, the first wire part 886 and the second wire part 888 may be shielded from each other via wire insulation and/or sheath and/or shield.

According to an aspect, a cable jacket 889 may be wrapped over the first wire part 886 and the second wire part 888 to bundle the first wire part 886 and the second wire part 888 together. Accordingly, the cable jacket 574 may surround the first wire part 886 with the predetermined resistor 332, $R_p$, and the second wire part 888 with the two oppositely oriented Zener diodes 634, 636. Hence, the first wire part 886 with the predetermined resistor 332, $R_p$, and the second wire part 888 with the two oppositely oriented Zener diodes 634, 636 may form a core of the cable assembly 880 with the cable jacket 889 sleeved over the first wire part 886 and the second wire part 888 together as a bundle. According to an aspect, the cable jacket 889 may also be wrapped over the first wire segment 882 extending away from the parallel circuit 633 from the first node 881 and the second wire segment 884 extending away from the parallel circuit 633 from the second node 883.

According to an aspect, the cable assembly 880 may include a first connector 885 at a free end of the first wire segment 882 (or a first end of the cable assembly 880) and a second connector 887 at a free end of the second wire segment 884 (or a second end of the cable assembly 880). According to an aspect, the electrical insulation arrangement 130 of the testing apparatus 600 may be in the form of the cable assembly 880 with the first end of the cable assembly 880 connected to the metallic thermal contact surface 122 (and/or the contact member 126 and/or the head unit 124) and the second end of the cable assembly 880 connected to the chassis electric reference potential 122. For example, the first connector 885 at first end of the cable assembly 880 may be connected to the metallic thermal contact surface 122 (and/or the contact member 126 and/or the head unit 124) and the second connector 887 at the second end of the cable assembly 880 may be connected to the chassis electric reference potential 122. Each of the first connector 885 and the second connector 887 may include, but not limited to, a spade connector, a tab connector, a fork connector, a blade connector, or the like.

Figure 9:
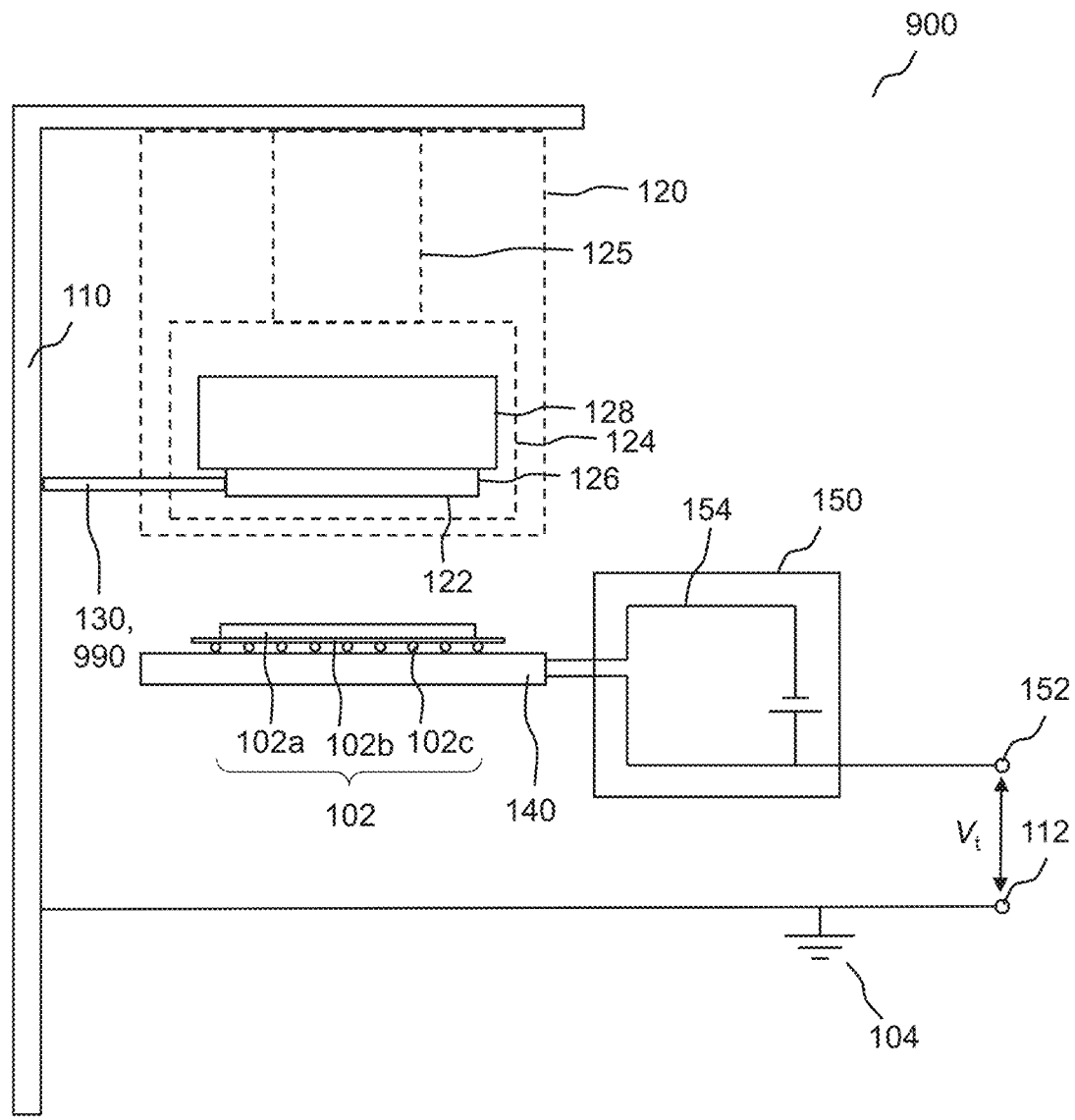
FIG. 9 shows a testing apparatus in a schematic view according to some aspects of the disclosure.

FIG. 9 shows a testing apparatus 900 as a variant of the testing apparatus 100 of FIG. 1 according to some aspects. The testing apparatus 900 of FIG. 9 may include all the features and limitations of the testing apparatus 100 of FIG. 1. Further, the testing apparatus 900 of FIG. 9 is illustrated with the electrical insulation arrangement 130 as being one or a plurality of electrically non-conductive hardware elements 990 connected between the metallic thermal contact surface 122 and the chassis electric reference potential 122. Hence, the testing apparatus 900 of FIG. 9 may include the one or a plurality of hardware elements 990 serving as a variant of the electrical insulation arrangement 130 for the testing apparatus 100 of FIG. 1, whereby the electrical insulation arrangement 130 may be made up of mechanical components. The hardware elements may be made of plastic. According to some aspects, the electrical insulation arrangement 130 of the testing apparatus 900 of FIG. 9 may include one or a combination of the electrically non-conductive hardware elements 990 including, but not limited to, a non-conductive spacer, a non-conductive washer, a non-conductive fastener, a non-conductive linkage, a non-conductive connector, or a non-conductive coupling. The one or the combination of the electrically non-conductive hardware elements 990 may be disposed at any one of a joint or mechanical connection anywhere between the metallic thermal contact surface 122 and the tester chassis 110 to establish an electrical insulation barrier between the metallic thermal contact surface 122 and the chassis electric reference potential 112. For example, the one or the combination of the electrically non-conductive hardware elements 990 may be disposed at a joint or mechanical connection between the head unit 124 and the actuator 125. As another example, the one or the combination of the electrically non-conductive hardware elements 990 may be disposed at a contact point between the contact member 126 and the tester chassis 110. In some conventional testing apparatus, the nickel-plated thermal interface of the thermal head may be directly grounded to a chassis of the conventional testing apparatus via direct contact with the chassis of the conventional testing apparatus. Accordingly, the one or the combination of the electrically non-conductive hardware elements 990 may be disposed at those direct contact points to electrically insulate the metallic thermal contact surface 122 and the chassis electric reference potential 112 for electrolytic corrosion protection.

Figure 10:
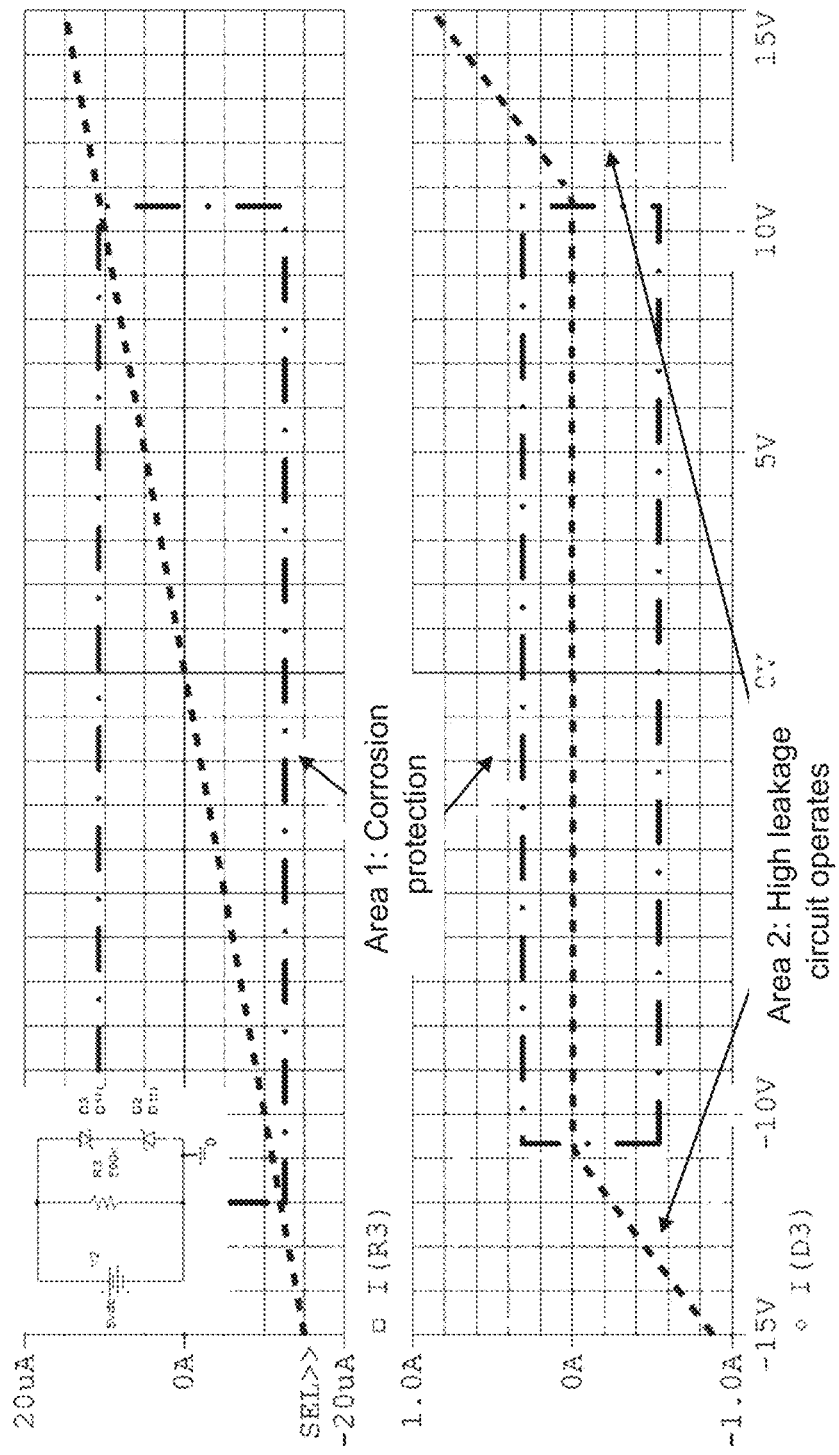
FIG. 10 shows simulation results in the form of current vs voltage curve based on the electrolytic corrosion protection system of FIG. 7.

FIG. 10 shows simulation results in the form of current vs voltage curve based on the electrolytic corrosion protection system 701 of FIG. 7. The top graph represents the simulation results in the form of current vs voltage curve for first path (or the circuit path 331) of the parallel circuit 633 with the predetermined resistor 332, $R_p$. The bottom graph represents the simulation results in the form of current vs voltage curve for second path 635 of the parallel circuit 633 with the two oppositely oriented Zener diodes 634, 636 connected in series along the second path 635. As clearly marked out by the boxes labelled as "Area 1" in FIG. 10, when the potential across the parallel circuit 633 is within the predetermined range, for example between −10V to 10V, the second path 635 clearly does not allow current to pass through. Hence, only the first path (or the circuit path 331) of the parallel circuit 633 with the predetermined resistor 332, $R_p$, may be operational and/or effective. Further, when when the potential across the parallel circuit 633 is outside the predetermined range, for example below −10V and/or above 10V, second path 635 clearly does not allow current to pass through.

Figure 11:
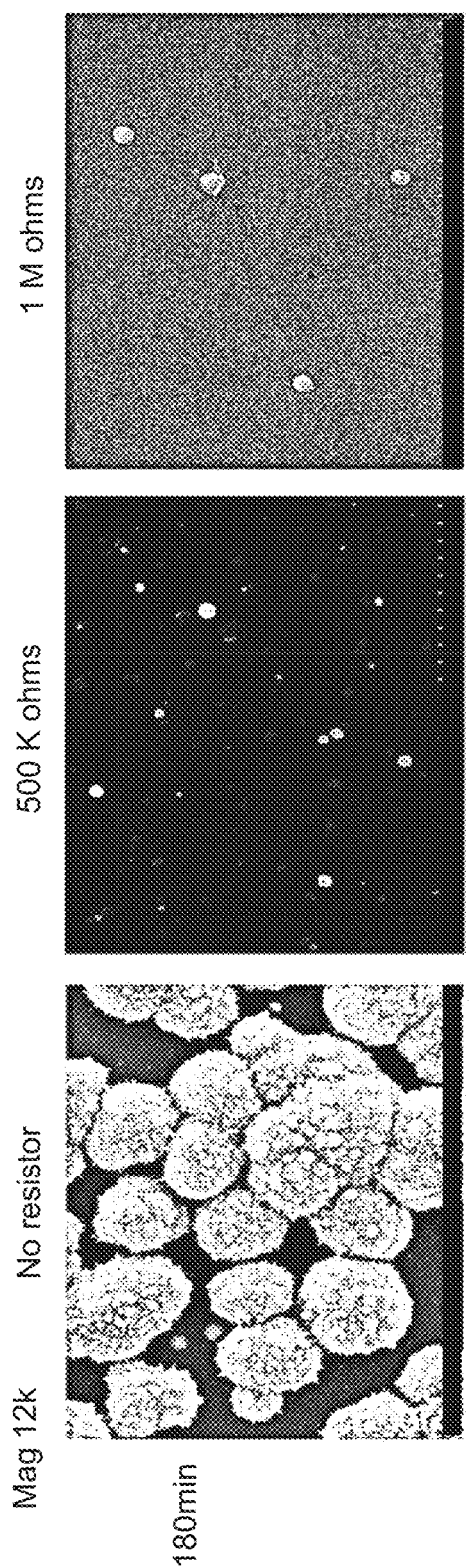
FIG. 11 shows experimental results based on the electrolytic corrosion protection system of FIG. 4.

FIG. 11 shows experimental results based on the electrolytic corrosion protection system of FIG. 4. As shown, when the metallic thermal contact surface 122 is directly grounded to the chassis electric reference potential 112 without any resistor, significant corrosion and stain signature may be observed on the DUT 102. However, when the predetermined resistor 332, $R_p$, having a resistance of about 500 K ohm is connected between the metallic thermal contact surface 122 and the chassis electric reference potential 112, a significant reduction in the corrosion and stain signature may be observed on the DUT 102. Further, when the predetermined resistor 332, $R_p$, having a resistance of about 1 M ohm is connected between the metallic thermal contact surface 122 and the chassis electric reference potential 112, an even lesser corrosion and stain signature may be observed on the DUT 102. Accordingly, the predetermined resistor 332, $R_p$, according to various aspects may have a resistance of 500 K ohm or more, or 1 M ohm or more.

Various aspects has provided an apparatus, a system and/or a method to reduce electrolytic reaction between a metallic thermal contact surface and a DUT during DUT testing by limiting the leakage current flowing between the metallic thermal contact surface and the DUT via identifying the electrolytic cell condition within the test system and providing electrical insulation to part of the electrolytic cell circuit within the test system. In addition, various aspects have also provided protection against leakage voltage from electric heater, whereby the leakage voltage may be much higher than the electrolytic cell potential. Various aspects have also solved the electrolytic corrosion issues without having to be dependent on the plating quality of the metallic thermal contact surface. Various aspects have also prolonged the life span of existing nickel plated metallic thermal contact member while avoiding the need to replace the existing nickel plated metallic thermal contact member with chrome plated replacement, thereby achieving cost-saving.

In the following, various examples are described that may refer to one or more aspects of the disclosure.

In Example 1, an apparatus is disclosed including a tester chassis connected to a chassis electric reference potential for electrostatic discharge grounding of the tester chassis; a thermal head assembly coupled to the tester chassis, the thermal head assembly having a metallic thermal contact surface; and an electrical insulation arrangement disposed between the metallic thermal contact surface and the chassis electric reference potential to electrically insulate the metallic thermal contact from the chassis electric reference potential.

In Example 2, the apparatus of Example 1 is disclosed further including a device-under-test (DUT) connector connectable with a DUT, wherein the thermal head assembly is operable to move the metallic thermal contact surface to contact the DUT when the DUT is connected to the DUT connector; and a test unit connected to the DUT connector for communicating with the DUT when the DUT is connected to the DUT connector, the test unit having a test circuit electric reference potential serving as a circuit ground for the test unit, wherein an electric potential difference exists between the chassis electric reference potential and the test circuit electric reference potential.

In Example 3, the apparatus of Example 1 is disclosed, wherein the electrical insulation arrangement includes a circuit path connecting the metallic thermal contact surface to the chassis electric reference potential, wherein the circuit path includes a predetermined resistor connected between the metallic thermal contact surface and the chassis electric reference potential.

In Example 4, the apparatus of Example 3 is disclosed, wherein the circuit path is embodied as a cable.

In Example 5, the apparatus of Example 4 is disclosed, wherein the cable includes a wire part with the predetermined resistor disposed along the wire part; and a cable jacket wrapped over the wire part.

In Example 6, the apparatus of Example 5 is disclosed, wherein the cable includes a first connector at an end of the cable, and a second connector at an opposite end of the cable.

In Example 7, the apparatus of Example 1 is disclosed, wherein the electrical insulation arrangement includes one or a combination of electrically non-conductive hardware elements including a non-conductive spacer, a non-conductive washer, a non-conductive fastener, a non-conductive linkage, a non-conductive connector, or a non-conductive coupling disposed at any one of a joint or mechanical connection anywhere between the metallic thermal contact surface and the tester chassis to establish an electrical insulation barrier between the metallic thermal contact surface and the chassis electric reference potential.

In Example 8, the apparatus of Example 1 is disclosed, wherein the thermal head assembly includes a head unit including a contact member having the metallic thermal contact surface; and an electric heater coupled to the contact member.

In Example 9, the apparatus of Example 8 is disclosed, wherein the electrical insulation arrangement is configured to electrically insulate the metallic thermal contact from the chassis electric reference potential when a potential across the electrical insulation arrangement is within a predetermined range, the electrical insulation arrangement includes a parallel circuit connecting the head unit to the chassis electric reference potential, wherein the parallel circuit includes a first path with a predetermined resistor connected between the head unit and the chassis electric reference potential, and a second path with two oppositely oriented Zener diodes connected in series between the head unit and the chassis electric reference potential, the first path and the second path being electrically parallel paths.

In Example 10, the apparatus of Example 9 is disclosed, wherein the parallel circuit is embodied as a cable with a first end of the cable connected to the head unit and a second end of the cable connected to the chassis electric reference potential.

In Example 11, the apparatus of Example 10 is disclosed, wherein the cable includes a first wire part with the predetermined resistor disposed along the first wire part; a second wire part with the two oppositely oriented Zener diodes connected in series along the second wire part, wherein an end of the first wire part and a corresponding end of the second wire part are connected together to form a first node and an opposite end of the first wire part and a corresponding opposite end of the second wire part are connected together to form a second node, wherein the first wire part and the second wire part are shielded from each other; and a cable jacket wrapped over the first wire part and the second wire part to bundle the first wire part and the second wire part together.

In Example 12, the apparatus of Example 11 is disclosed, wherein the cable includes a first connector at the first end of the cable, the first connector being connected to the first node, and a second connector at the second end of the cable, the second connector being connected to the second node.

In Example 13, the apparatus of Example 8 is disclosed, wherein electrical insulation arrangement includes one or a combination of electrically non-conductive hardware elements including a non-conductive spacer, a non-conductive washer, a non-conductive fastener, a non-conductive linkage, a non-conductive connector, or a non-conductive coupling disposed at any one of a joint or mechanical connection anywhere between the head unit and the tester chassis to establish an electrical insulation barrier between the metallic thermal contact surface and the chassis electric reference potential.

In Example 14, a cable assembly is disclosed including a first wire segment; a second wire segment; and a parallel circuit connected between the first wire segment and the second wire segment, the parallel circuit having a first path with a predetermined resistor connected between a first node and a second node, and a second path with two oppositely oriented Zener diodes connected in series between the first node and the second node, the first path and the second path being electrically parallel paths, wherein the first wire segment is connected to the first node and the second wire segment is connected to the second node.

In Example 15, the cable assembly of Example 14 is disclosed further including a first wire part with the predetermined resistor disposed along the first wire part; a second wire part with the two oppositely oriented Zener diodes connected in series along the second wire part, wherein an end of the first wire part and a corresponding end of the second wire part are connected together to form the first node and an opposite end of the first wire part and a corresponding opposite end of the second wire part are connected together to form the second node, wherein the first wire part and the second wire part are shielded from each other; and a cable jacket wrapped over the first wire part and the second wire part to bundle the first wire part and the second wire part together.

In Example 16, the cable assembly of Example 15 is disclosed further including a first connector at a free end of the first wire segment, and a second connector at a free end of the second wire segment.

In Example 17, a system is disclosed including a test circuit configured to receive a device-under-test (DUT) and to run test programs on the DUT, the test circuit having a test circuit electric reference potential serving as a circuit ground for the test circuit; a metallic thermal contact surface configured to contact the DUT connected to the test circuit and operable to regulate a temperature of the DUT when in contact with the DUT during testing; a chassis electric reference potential for electrostatic discharge grounding of a tester chassis; and an electrical insulation arrangement connected between the metallic thermal contact surface and the chassis electric reference potential to insulate the metallic thermal contact surface from the chassis electric reference potential, wherein an electric potential difference exists between the chassis electric reference potential and the test circuit electric reference potential.

In Example 18, the system of Example 17 is disclosed further including a heater circuit configured to control a temperature of the metallic thermal contact surface for regulating the temperature of the DUT when in contact with the DUT during testing.

In Example 19, the system of Example 18 is disclosed, wherein the electrical insulation arrangement is configured to electrically insulate the metallic thermal contact from the chassis electric reference potential when a potential across the electrical insulation arrangement is within a predetermined range, the electrical insulation arrangement includes a parallel circuit connecting the metallic thermal contact surface to the chassis electric reference potential, wherein the parallel circuit includes a first path with a predetermined resistor connected between the metallic thermal contact surface and the chassis electric reference potential, and a second path with two oppositely oriented Zener diodes connected in series between the metallic thermal contact surface and the chassis electric reference potential, the first path and the second path being electrically parallel paths.

In Example 20, the system of Example 17 is disclosed, wherein the electrical insulation arrangement includes one or a combination of electrically non-conductive hardware elements including a non-conductive spacer, a non-conductive washer, a non-conductive fastener, a non-conductive linkage, a non-conductive connector, or a non-conductive coupling disposed at any one of a joint or mechanical connection anywhere between the metallic thermal contact surface and the tester chassis to establish an electrical insulation barrier between the metallic thermal contact surface and the chassis electric reference potential.

While the disclosure has been particularly shown and described with reference to specific aspects, it should be understood by those skilled in the art that various changes in form and detail may be made therein without departing from the spirit and scope of the disclosure as defined by the appended claims. The scope of the disclosure is thus indicated by the appended claims and all changes, which come within the meaning and range of equivalency of the claims, are therefore intended to be embraced.

What is claimed is:

1. An apparatus comprising:
 a tester chassis connected to a chassis electric reference potential for electrostatic discharge grounding of the tester chassis;
 a thermal head assembly coupled to the tester chassis, the thermal head assembly having a metallic thermal contact surface; and
 an electrical insulation arrangement disposed between the metallic thermal contact surface and the chassis electric reference potential to electrically insulate the metallic thermal contact from the chassis electric reference potential.

2. The apparatus as claimed in claim 1, further comprising a device-under-test (DUT) connector connectable with a DUT, wherein the thermal head assembly is operable to move the metallic thermal contact surface to contact the DUT when the DUT is connected to the DUT connector; and
 a test unit connected to the DUT connector for communicating with the DUT when the DUT is connected to the DUT connector, the test unit having a test circuit electric reference potential serving as a circuit ground for the test unit,
 wherein an electric potential difference exists between the chassis electric reference potential and the test circuit electric reference potential.

3. The apparatus as claimed in claim 1, wherein the electrical insulation arrangement comprises
 a circuit path connecting the metallic thermal contact surface to the chassis electric reference potential, wherein the circuit path comprises a predetermined resistor connected between the metallic thermal contact surface and the chassis electric reference potential.

4. The apparatus as claimed in claim 3, wherein the circuit path is embodied as a cable.

5. The apparatus as claimed in claim 4, wherein the cable comprises
 a wire part with the predetermined resistor disposed along the wire part; and
 a cable jacket wrapped over the wire part.

6. The apparatus as claimed in claim 5, wherein the cable comprises
 a first connector at an end of the cable, and
 a second connector at an opposite end of the cable.

7. The apparatus as claimed in claim 1, wherein the electrical insulation arrangement comprises one or a combination of electrically non-conductive hardware elements including a non-conductive spacer, a non-conductive washer, a non-conductive fastener, a non-conductive linkage, a non-conductive connector, or a non-conductive coupling disposed at any one of a joint or mechanical connection anywhere between the metallic thermal contact surface and the tester chassis to establish an electrical insulation barrier between the metallic thermal contact surface and the chassis electric reference potential.

8. The apparatus as claimed in claim 1, wherein the thermal head assembly comprises a head unit comprising
 a contact member having the metallic thermal contact surface; and
 an electric heater coupled to the contact member.

9. The apparatus as claimed in claim 8, wherein the electrical insulation arrangement is configured to electrically insulate the metallic thermal contact from the chassis electric reference potential when a potential across the electrical insulation arrangement is within a predetermined range, the electrical insulation arrangement comprises
    a parallel circuit connecting the head unit to the chassis electric reference potential, wherein the parallel circuit comprises
        a first path with a predetermined resistor connected between the head unit and the chassis electric reference potential, and
        a second path with two oppositely oriented Zener diodes connected in series between the head unit and the chassis electric reference potential, the first path and the second path being electrically parallel paths.

10. The apparatus as claimed in claim 9, wherein the parallel circuit is embodied as a cable with a first end of the cable connected to the head unit and a second end of the cable connected to the chassis electric reference potential.

11. The apparatus as claimed in claim 10, wherein the cable comprises
    a first wire part with the predetermined resistor disposed along the first wire part;
    a second wire part with the two oppositely oriented Zener diodes connected in series along the second wire part, wherein an end of the first wire part and a corresponding end of the second wire part are connected together to form a first node and an opposite end of the first wire part and a corresponding opposite end of the second wire part are connected together to form a second node, wherein the first wire part and the second wire part are shielded from each other; and
    a cable jacket wrapped over the first wire part and the second wire part to bundle the first wire part and the second wire part together.

12. The apparatus as claimed in claim 11, wherein the cable comprises
    a first connector at the first end of the cable, the first connector being connected to the first node, and
    a second connector at the second end of the cable, the second connector being connected to the second node.

13. The apparatus as claimed in claim 8, wherein the electrical insulation arrangement comprises one or a combination of electrically non-conductive hardware elements including a non-conductive spacer, a non-conductive washer, a non-conductive fastener, a non-conductive linkage, a non-conductive connector, or a non-conductive coupling disposed at any one of a joint or mechanical connection anywhere between the head unit and the tester chassis to establish an electrical insulation barrier between the metallic thermal contact surface and the chassis electric reference potential.

14. A cable assembly comprising:
    a first wire segment;
    a second wire segment; and
    a parallel circuit connected between the first wire segment and the second wire segment, the parallel circuit having
        a first path with a predetermined resistor connected between a first node and a second node, and
        a second path with two oppositely oriented Zener diodes connected in series between the first node and the second node, the first path and the second path being electrically parallel paths,
    wherein the first wire segment is connected to the first node and the second wire segment is connected to the second node.

15. The cable assembly as claimed in claim 14, further comprising
    a first wire part with the predetermined resistor disposed along the first wire part;
    a second wire part with the two oppositely oriented Zener diodes connected in series along the second wire part, wherein an end of the first wire part and a corresponding end of the second wire part are connected together to form the first node and an opposite end of the first wire part and a corresponding opposite end of the second wire part are connected together to form the second node, wherein the first wire part and the second wire part are shielded from each other; and
    a cable jacket wrapped over the first wire part and the second wire part to bundle the first wire part and the second wire part together.

16. The cable assembly as claimed in claim 15, further comprising
    a first connector at a free end of the first wire segment, and
    a second connector at a free end of the second wire segment.

17. A system comprising:
    a test circuit configured to receive a device-under-test (DUT) and to run test programs on the DUT, the test circuit having a test circuit electric reference potential serving as a circuit ground for the test circuit;
    a metallic thermal contact surface configured to contact the DUT connected to the test circuit and operable to regulate a temperature of the DUT when in contact with the DUT during testing;
    a chassis electric reference potential for electrostatic discharge grounding of a tester chassis; and
    an electrical insulation arrangement connected between the metallic thermal contact surface and the chassis electric reference potential to insulate the metallic thermal contact surface from the chassis electric reference potential,
    wherein an electric potential difference exists between the chassis electric reference potential and the test circuit electric reference potential.

18. The system as claimed in claim 17, further comprising a heater circuit configured to control a temperature of the metallic thermal contact surface for regulating the temperature of the DUT when in contact with the DUT during testing.

19. The system as claimed in claim 18, wherein the electrical insulation arrangement is configured to electrically insulate the metallic thermal contact from the chassis electric reference potential when a potential across the electrical insulation arrangement is within a predetermined range, the electrical insulation arrangement comprises
    a parallel circuit connecting the metallic thermal contact surface to the chassis electric reference potential, wherein the parallel circuit comprises
        a first path with a predetermined resistor connected between the metallic thermal contact surface and the chassis electric reference potential, and
        a second path with two oppositely oriented Zener diodes connected in series between the metallic thermal contact surface and the chassis electric reference potential, the first path and the second path being electrically parallel paths.

20. The system as claimed in claim 17, wherein the electrical insulation arrangement comprises one or a combination of electrically non-conductive hardware elements including a non-conductive spacer, a non-conductive washer, a non-conductive fastener, a non-conductive linkage, a non-conductive connector, or a non-conductive coupling disposed at any one of a joint or mechanical connection anywhere between the metallic thermal contact surface and the tester chassis to establish an electrical insulation barrier between the metallic thermal contact surface and the chassis electric reference potential.

\* \* \* \* \*